(12) United States Patent
Kianush

(10) Patent No.: US 6,771,943 B2
(45) Date of Patent: Aug. 3, 2004

(54) IMAGE REJECTION

(75) Inventor: Kaveh Kianush, Eindhoven (NL)

(73) Assignee: Koninklijke Philips Electronics N.V., Eindhoven (NL)

(*) Notice: Subject to any disclaimer, the term of this patent is extended or adjusted under 35 U.S.C. 154(b) by 487 days.

(21) Appl. No.: 09/739,504

(22) Filed: Dec. 18, 2000

(65) Prior Publication Data

US 2001/0027094 A1 Oct. 4, 2001

(30) Foreign Application Priority Data

Dec. 23, 1999 (EP) .......................................... 99204499

(51) Int. Cl.[7] .............................................. H04B 1/18
(52) U.S. Cl. ............................... 455/192.1; 455/226.1; 455/302; 455/285
(58) Field of Search .......................... 455/192.1, 192.3, 455/226.1–226.4, 302, 169.1, 296, 283, 284, 285, 255, 67.11–67.13

(56) References Cited

U.S. PATENT DOCUMENTS

| 3,671,870 A | * | 6/1972 | Heinz ...................... 455/169.2 |
| 4,152,652 A | * | 5/1979 | Taylor et al. ............. 455/226.2 |
| 4,696,055 A | * | 9/1987 | Marshall ..................... 455/302 |
| 4,881,272 A | * | 11/1989 | Eguchi ........................ 455/143 |
| 5,230,099 A | | 7/1993 | Loper .......................... 455/324 |
| 5,321,852 A | * | 6/1994 | Seong ...................... 455/192.1 |
| 5,826,180 A | * | 10/1998 | Golan ......................... 455/302 |
| 5,983,088 A | * | 11/1999 | Aschwanden ............ 455/190.1 |
| 6,370,368 B1 | * | 4/2002 | Kianush ...................... 455/255 |
| 6,427,068 B1 | * | 7/2002 | Suominen ................... 455/302 |

FOREIGN PATENT DOCUMENTS

| EP | 0496621 | 7/1992 | ............ H04B/1/16 |
| GB | 2111335 A | * 6/1983 | ............ H03J/7/18 |

* cited by examiner

Primary Examiner—Edward F. Urban
Assistant Examiner—Lana Le

(57) ABSTRACT

Radio receivers are known in the art. A conventional receiver requires external components for RF/image selectivity, IF selectivity and demodulation. Other solutions are, for example, a number of correction algorithms, which is an expensive solution. Instead, the "weak" image point is positioned at the side of the desired channel with the lowest unwanted RF signal strength. While this does not necessarily increase the actual image rejection, the perceived image rejection is clearly improved.

4 Claims, 5 Drawing Sheets

IMAGE REJECTION

BACKGROUND OF THE INVENTION

1. Field of the Invention

The invention relates to a receiver comprising an input for receiving an antenna signal, an output for supplying an audio signal, first and second mixing means for mixing the antenna signal with a first and second oscillation signal to obtain an in-phase and quadrature signal, filter means for filtering the in-phase and quadrature signal, demodulation means for demodulating the filtered quadrature signals and an oscillator for supplying the first and second oscillation signal to the first and second mixing means.

The invention further relates to a method for tuning a tuner to a predetermined frequency.

2. Description of the Related Art

Receivers are known in the art. A conventional receiver architecture requires external components for RF/image selectivity, IF selectivity and demodulation. To facilitate full integration of receivers, numerous novel architectures have been proposed. For a broadcast network where little or no information is present at the carrier frequency, for example, GSM or DAB, the zero-IF architecture is a good solution. However, broadcast systems with much information at the carrier frequency, for example, standard AM/FM broadcast cannot tolerate the DC consequences of the conversion to zero frequency.

Therefore, the low IF architecture has been proposed to solve this problem. However, converting the signal to a very low IF has the drawback that no image rejection can be carried out prior to this frequency conversion. The remedy to this is to use quadrature signal processing as is well known in the art. The limiting aspect of the quadrature low-IF architecture is that it delivers integrated image rejection based on matching of parameters, such as, gain and phase, of the quadrature channels. In practice, the matching of components in an integrated circuit limits this to about 40 dB. Some applications, for example, the mono-portable FM radio, can accept this limitation. But other applications, such as, FM stereo for portable and car application, require at least 60 dB of image rejection. To solve this matching problem, a number of correction algorithms have been developed. Unfortunately, these algorithms are only suitable for digital realization. The extra cost involved in digitalization make these solutions out of reach for cheap portable radio type of applications, for example.

European Patent Application No. EP-B-0 496 621, corresponding to U.S. Pat. 5,230,099, discloses a receiver having a number of correction algorithms. However, this is an expensive solution, and certainly not suitable for cheaper applications, such as portable radio receivers.

SUMMARY OF THE INVENTION

An object of the invention is to provide a receiver having additional effective image rejection suitable for all receiver realizations with very little additional complexity. This is achieved with a receiver according to the invention, characterized in that the receiver comprises measuring means for measuring a level of disturbance at a first and second predetermined frequency distance from the chosen frequency, comparing means for comparing the measured first and second level of disturbance, choosing means for choosing the frequency band with the lowest level of disturbance, and a control means for controlling the oscillator.

The idea of the invention is to position, at will, the "weak" image point at the side of the wanted channel with the lowest unwanted RF signal strength. In this way, also, while the actual image rejection of the circuit has not necessarily been increased, the actual perceived image rejection is clearly improved.

BRIEF DESCRIPTION OF THE DRAWINGS

With the above and additional objects and advantages in mind as will hereinafter appear, the invention will be described with reference to the accompanying drawings, in which.

DESCRIPTION OF THE PREFERRED EMBODIMENTS

Figure 1:
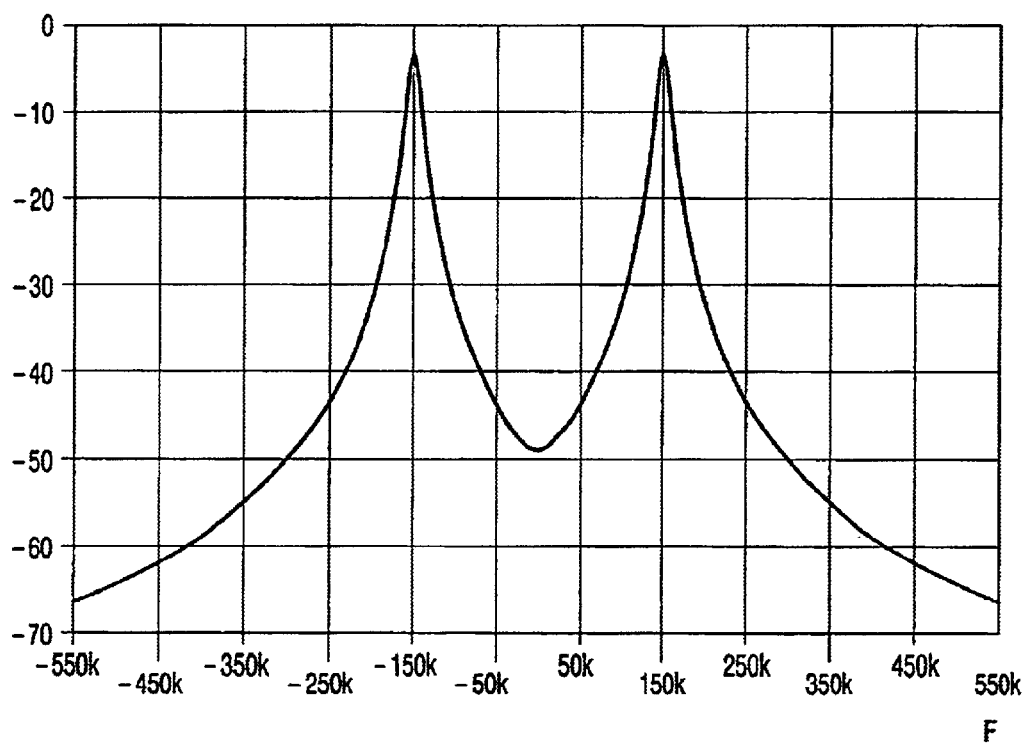
FIG. 1 shows a graph of the IF channel characteristics of a prior art receiver without image rejection.

FIG. 1 shows the IF channel characteristics of a prior art receiver without image rejection and/or complex IF (intermediate frequency) filtering. Here, the IF is chosen to be 150 kHz (desired signal d) and the modulation is narrowband FM for simplicity. From the Figure, it is clear that the unwanted signals (image i at −150 kHz) are not rejected at all. This would cause unacceptable co-channel interference.

Figure 2:
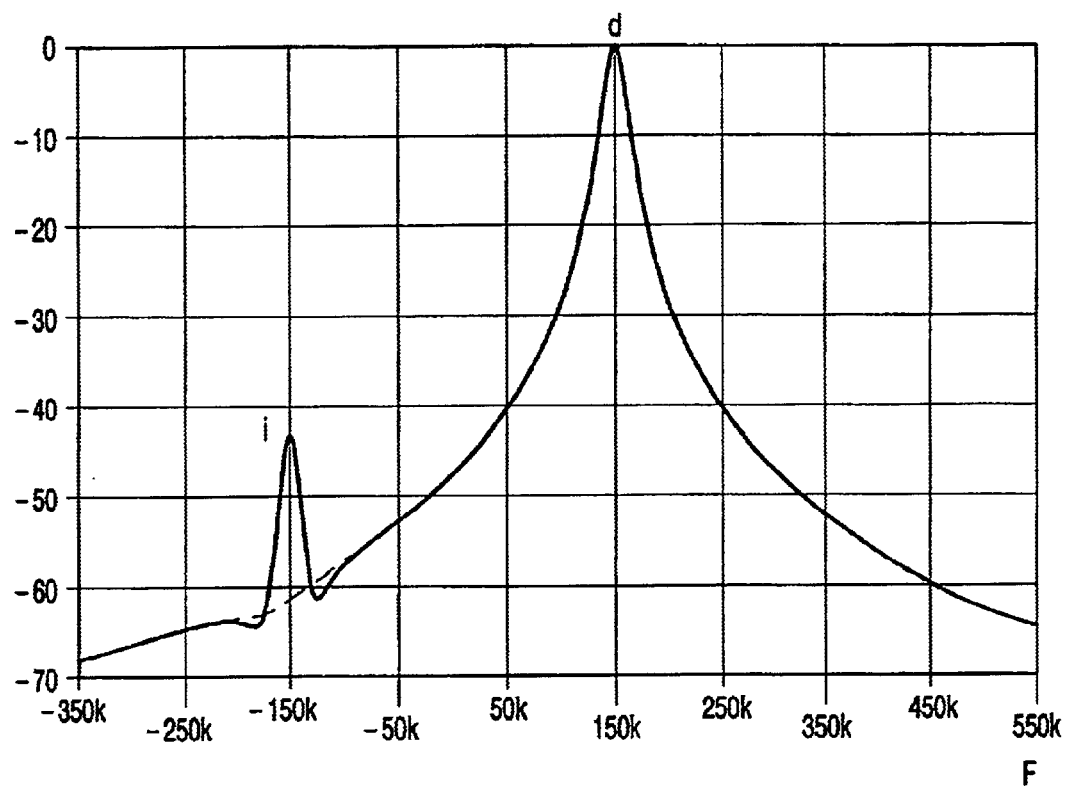
FIG. 2 shows a graph of the IF channel characteristics of a prior art receiver with complex image rejection.

FIG. 2 shows the IF channel characteristics of a prior receiver with complex image rejection. In the Figure, the ideal situation is shown with the dashed line (no image i at −150 kHz). Also here, the IF (desired signal d) is chosen to be 150 kHz and the modulation is narrow-band FM for simplicity. But, as component-matching limitations will occur in real situations, this limited component matching in the integrated circuit will result in limited image rejection with an image at −150 kHz.

Figure 3:
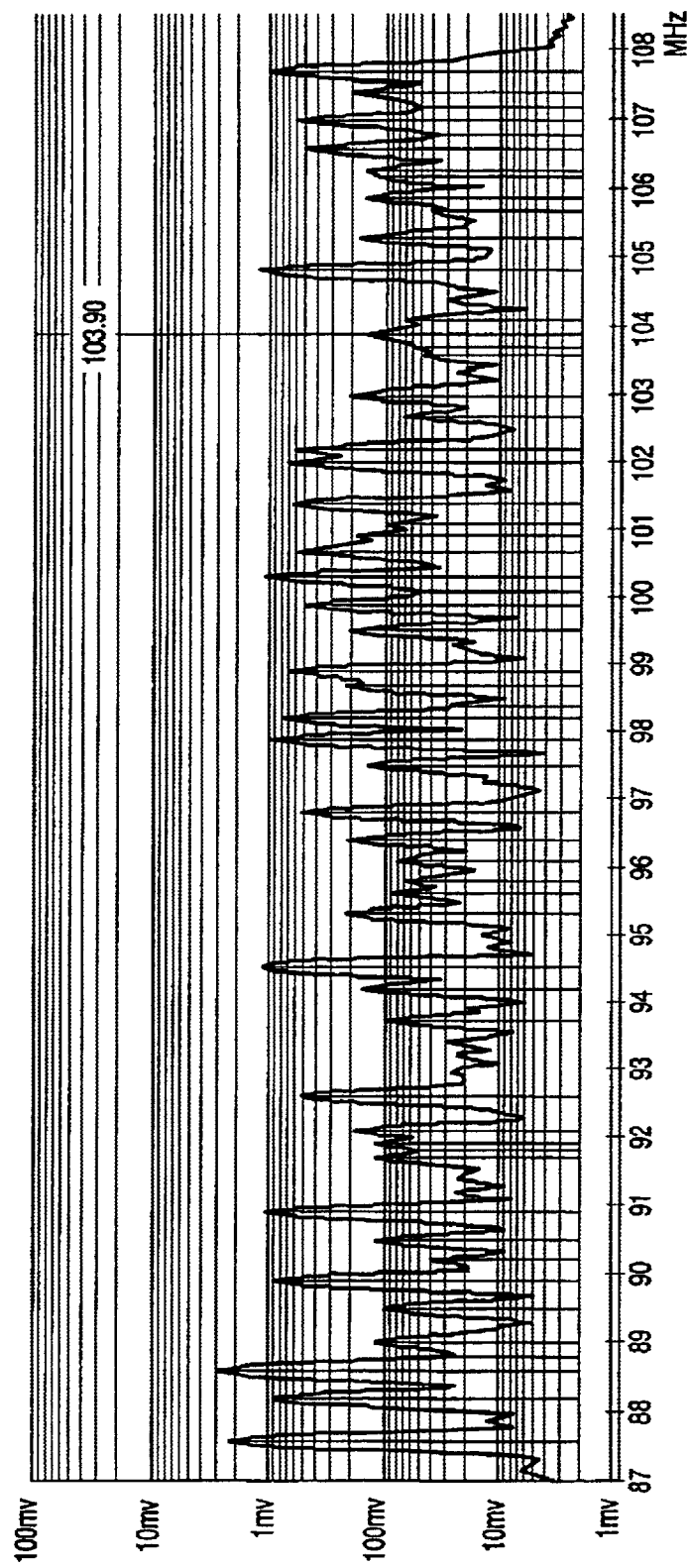
FIG. 3 shows an example of a typical RF spectrum of the FM reception band.

In FIG. 3, an example of a typical RF spectrum of the FM reception band is shown. Herein, it is illustrated that signal distribution has a random nature within the crowded reception band. A close examination of such spectra reveals that a large unwanted signal at the image frequency distance can be present either above or below the wanted signal, but almost never on both sides at the same time. This statistical distribution of the signals is utilized in this invention.

The idea of the invention is to position, at will, the "weak" image point at the side of the wanted channel with the lowest unwanted RF signal strength. In this way, although the actual image rejection has not necessarily been increased, the actual perceived image rejection is improved.

Figure 4:
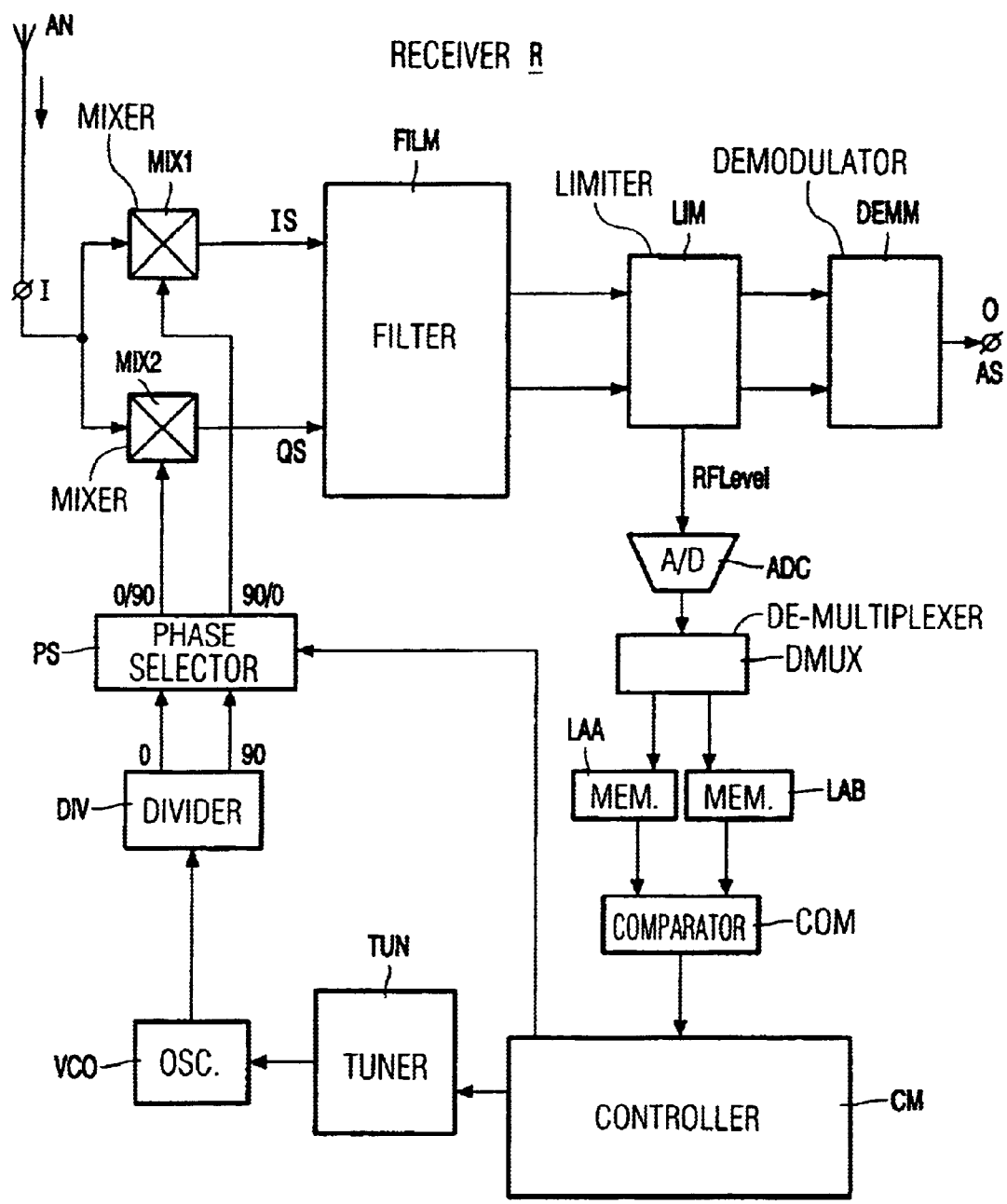
FIG. 4 shows a circuit block diagram of a receiver according to the invention.

In FIG. 4, a receiver R according to the invention is shown. This receiver comprises an input I for receiving an antenna signal from an antenna AN. The input I is coupled to a first and second mixer MIX1 and MIX2, respectively. At the other input, the respective mixers receive a first and second oscillator signal from an oscillator VCO via a divider DIV and a phase selector PS. The operation will be described below.

The output of the mixer MIX1 supplies the so-called in-phase signal IS and the output of the mixer MIX2 supplies the so-called quadrature signal QS. Both outputs are coupled to respective inputs of filter means FILM.

The filter means supplies a first and second output signal via a limiter LIM to demodulator means DEMM. After demodulation of the complex signal, the demodulated signal is supplied to an output O for supplying an audio signal AS, for example, to loudspeakers (not shown).

The limiter LIM is also coupled to an A/D converter ADC for supplying a signal that is an indication of the RF level. The A/D converter is coupled to de-multiplexing means DMUX and first and second storing means LAA and LAB. The two stored values are compared in comparing means COM. The comparing means is coupled to a control CM for supplying a signal to the voltage-controlled oscillator VCO via tuning means TUN. The control means further supplies a signal to the phase selector PS for deciding which phase is chosen for the first and second mixer MIX1 and MIX2.

The pass-band position of the filter means FILM is determined by the In-phase and Quadrature (I/Q) signals, which are, in turn, defined by, among others, the phase direction of the divided oscillator signals. The control means CM defines the divider output connections that set the phase relation.

The tuning procedure for a wanted frequency Fa is described as follows.

First, tune the receiver R to Fa+2×IF frequency, with an arbitrary but defined setting of the divider DIV output phase and the audio output O of the receiver muted. Note that the image signal will be at a frequency distance of 2×IF from the wanted signal. Then measure the RF level of this unwanted signal. This can be done by standard RSSI type of circuitry, often incorporated in a limiter LIM. This measured RF level value is stored in a memory. A simple implementation is as shown in FIG. 4, where first, the RF level is converted from analog to digital with the A/D converter ADC, followed by de-multiplexing in the de-multiplexer DMUX and storing in a latch, for example, the first latch LAA.

Figure 5:
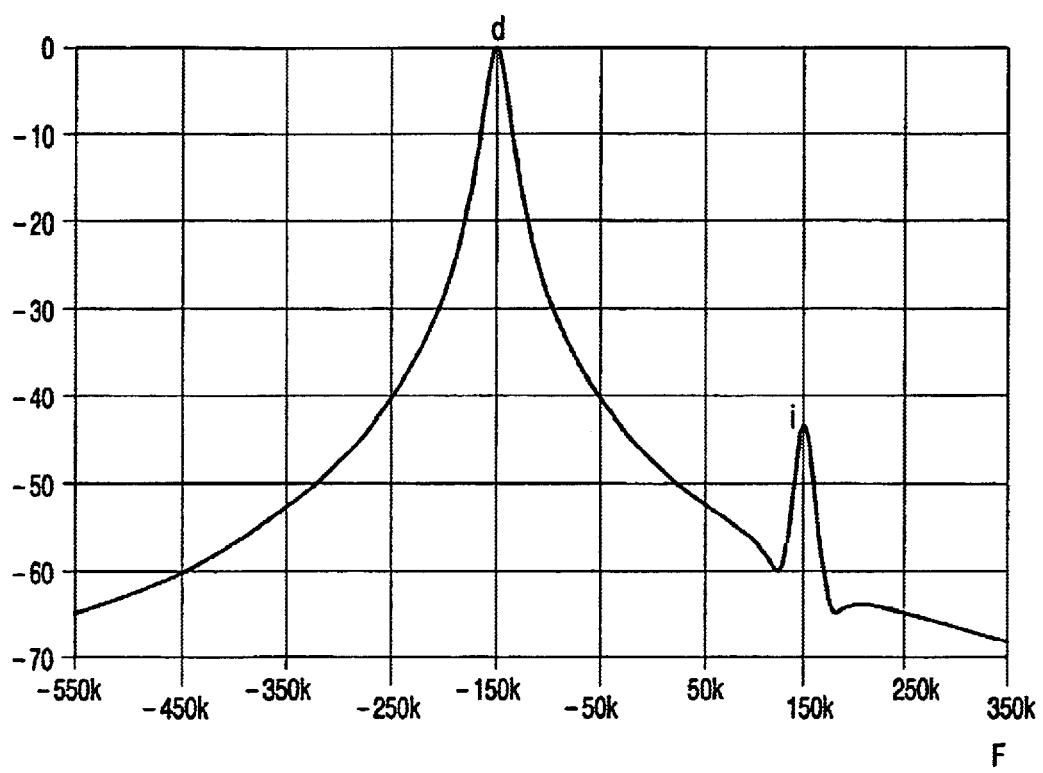
FIG. 5 shows a graph of IF channel characteristics of the receiver according to the invention.

After this, the receiver is then tuned to Fa−2×IF, with the same phase of the divider DIV and the audio signal still muted. Again the RF level signal is measured and stored in the second latch LAB. The IF transfer characteristics for this mode is shown in FIG. 5. The results of these RF signal strength measurements are then compared to determine the position of the lower interfering signal.

The receiver is then tuned to the actual Fa frequency, with the control means CM setting the divider DIV output phase such that the image of the filter means would fall at this lower interfering signal. The tuning operation is now complete and the audio signal is de-muted.

Therefore, each tuning operation of a receiver, according to the method of the invention, is subdivided into 3 separate steps, i.e., 2 measurement steps and a final tuning step. The coordination of the individual steps is carried out automatically by the control algorithm of the control means CM. Preferably, the user is unaware of these separate operations, since they are carried out during the customary audio-mute period of the tuning operation. Although the image rejection cannot be expressed in exact figures, typical spectral measurement (see FIG. 3) suggests that, effectively, an extra 20 dB of image suppression is achievable. This makes the Low-IF architecture suitable for FM stereo applications.

The principles behind the above algorithm can also be applied to other receiver systems, regardless of the modulation scheme or IF choice.

What is claimed is:

1. A receiver comprising:
    an input for receiving an antenna signal;
    an output for supplying an audio signal;
    first and second mixing means for mixing the antenna signal with a first and second oscillation signal forming an in-phase signal and a quadrature signal;
    filter means for filtering the in-phase and quadrature signals;
    demodulation means for demodulating the filtered quadrature signals; and
    an oscillator for supplying the first and second oscillation signal to the first and second mixing means, characterized in that the receiver further comprises:
        measuring means for measuring a level of disturbance at a first and second predetermined frequency distance from a desired frequency;
        comparing means for comparing the measured first and second levels of disturbance;
        choosing means for choosing one of the first and second frequencies having the lowest level of disturbance; and
        control means for controlling the oscillator.

2. The receiver as claimed in claim 1, characterized in that the receiver further comprises phase selector coupled between the oscillator and the mixing means, and the control means supplies a control signal to said phase selector.

3. The receiver as claimed in claim 1, characterized in that the measuring means comprises:
    an A/D converter;
    a demultiplexer; and
    further storing means for storing the measured levels of disturbance.

4. A method for tuning a tuner to a desired frequency, said method comprising the steps:
    tuning said tuner to a first frequency at a first predetermined frequency from said desired frequency;
    measuring a first level of disturbance at said first frequency;
    tuning said tuner to a second frequency at a second predetermined frequency from said desired frequency;
    measuring a second level of disturbance at said second frequency;
    comparing the first and second levels of disturbance;
    choosing one of the first and second frequencies having the lowest level of disturbance; and
    tuning of the receiver to the desired frequency while positioning an image of a signal at said desired frequency at said chosen first or second frequency.

* * * * *